(12) United States Patent
Pang et al.

(10) Patent No.: US 8,395,051 B2
(45) Date of Patent: Mar. 12, 2013

(54) DOPING OF LEAD-FREE SOLDER ALLOYS AND STRUCTURES FORMED THEREBY

(75) Inventors: Mengzhi Pang, Phoenix, AZ (US); Charan Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 806 days.

(21) Appl. No.: 12/317,598

(22) Filed: Dec. 23, 2008

(65) Prior Publication Data
US 2010/0155115 A1 Jun. 24, 2010

(51) Int. Cl.
*H05K 1/09* (2006.01)
*B23K 31/02* (2006.01)
*H05K 7/10* (2006.01)

(52) U.S. Cl. ....... 174/257; 174/260; 228/256; 427/96.1; 361/767; 361/771; 361/779

(58) Field of Classification Search .................. 174/257, 174/260; 228/256; 427/96.1; 361/767, 771, 361/779
See application file for complete search history.

(56) References Cited

U.S. PATENT DOCUMENTS

| | | | |
|---|---|---|---|
| 6,139,979 A * | 10/2000 | Takaoka et al. | 428/646 |
| 6,231,691 B1 * | 5/2001 | Anderson et al. | 148/400 |
| 6,610,595 B2 | 8/2003 | Seshan | |
| 2003/0230361 A1 * | 12/2003 | Takahashi | 148/24 |
| 2005/0008525 A1 * | 1/2005 | Pfarr et al. | 420/560 |
| 2005/0082337 A1 * | 4/2005 | Riedl | 228/56.3 |
| 2006/0009022 A1 * | 1/2006 | Srivastava et al. | 438/613 |
| 2006/0043156 A1 * | 3/2006 | Debelius et al. | 228/180.22 |
| 2006/0263234 A1 | 11/2006 | Seelig | |
| 2007/0004086 A1 | 1/2007 | Hua et al. | |
| 2007/0144769 A1 * | 6/2007 | Salama | 174/260 |
| 2007/0172381 A1 * | 7/2007 | Deram | 420/561 |
| 2009/0173770 A1 * | 7/2009 | Izumida et al. | 228/173.5 |
| 2009/0304545 A1 | 12/2009 | Tanaka et al. | |

FOREIGN PATENT DOCUMENTS

| | | |
|---|---|---|
| JP | 2007-237249 | 9/2007 |
| JP | 2007268569 A | 10/2007 |
| KR | 10-2008-0101643 A | 11/2008 |
| WO | 2010/074956 A2 | 7/2010 |
| WO | 2010/074956 A3 | 8/2010 |

OTHER PUBLICATIONS

International Search Report and Written Opinion Received for PCT Patent Application No. PCT/US2009/067113, mailed on Jul. 6, 2010, 10 pages.
International Preliminary Report on Patentability for International Application No. PCT/US2009/067113, dated Jul. 7, 2011, 6 pp.
Office Action 1 for GB Application No. GB1112621.6, dated Aug. 15, 2011, 4 pp.
Office Action 2 for GB Application No. GB1112621.6, dated Feb. 6, 2012, 5 pp.
Response to Office Action 1 for GB Application No. GB1112621.6, dated Dec. 15, 2011, 11 pp.
Office Action 1 for JP Application No. 2011-538737, dated Oct. 2, 2012, 7 pp.

* cited by examiner

*Primary Examiner* — Zachary M Pape
(74) *Attorney, Agent, or Firm* — Konrad Raynes Davda & Victor LLP; Alan S. Raynes

(57) ABSTRACT

Methods of forming a microelectronic structure are described. Those methods include doping a lead free solder material with nickel, wherein the nickel comprises up to about 0.2 percent by weight of the solder material, and then applying the solder material to a substrate comprising a copper pad.

6 Claims, 6 Drawing Sheets

DOPING OF LEAD-FREE SOLDER ALLOYS AND STRUCTURES FORMED THEREBY

BACKGROUND OF THE INVENTION

As microelectronic packaging technology advances for higher device performance, solder joint reliability is becoming an important concern. Package reliability issues, which in some cases may be related to solder interconnect joint (i.e., the interface between an interconnect structure and another surface, such as a substrate or contact pad) failures, have been observed in many types of packaging assemblies, such as in ball grid array (BGA) assemblies.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
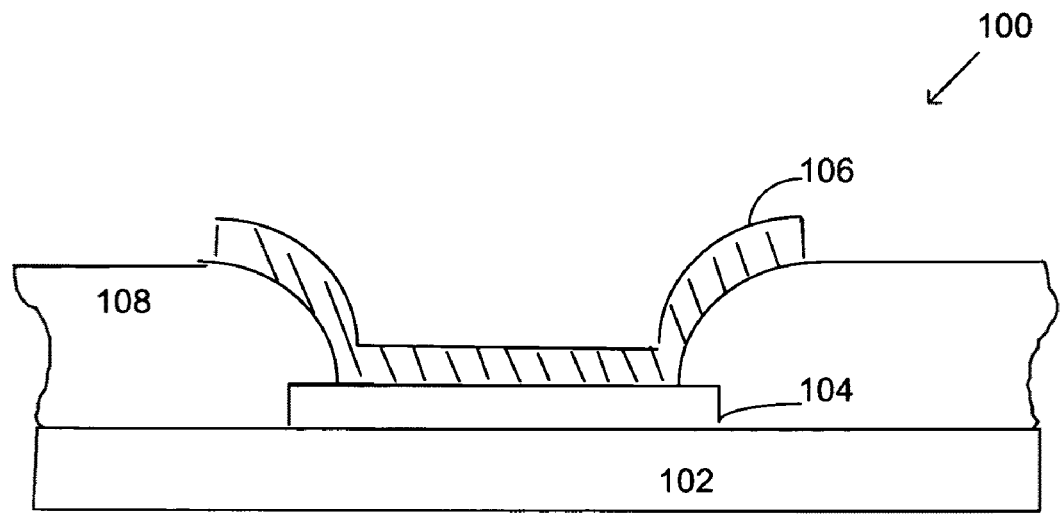
FIGS. 1a-1c represent methods of forming structures according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure, such as a joint structure, are described. Those methods may comprise doping a lead free solder material with nickel, wherein the nickel comprises up to about 0.2 percent by weight of the solder material, and then applying the solder material to a substrate comprising a copper pad. Methods of the present invention may significantly improve solder joint strength and electromigration resistance in microelectronic packages.

Figure 1B:
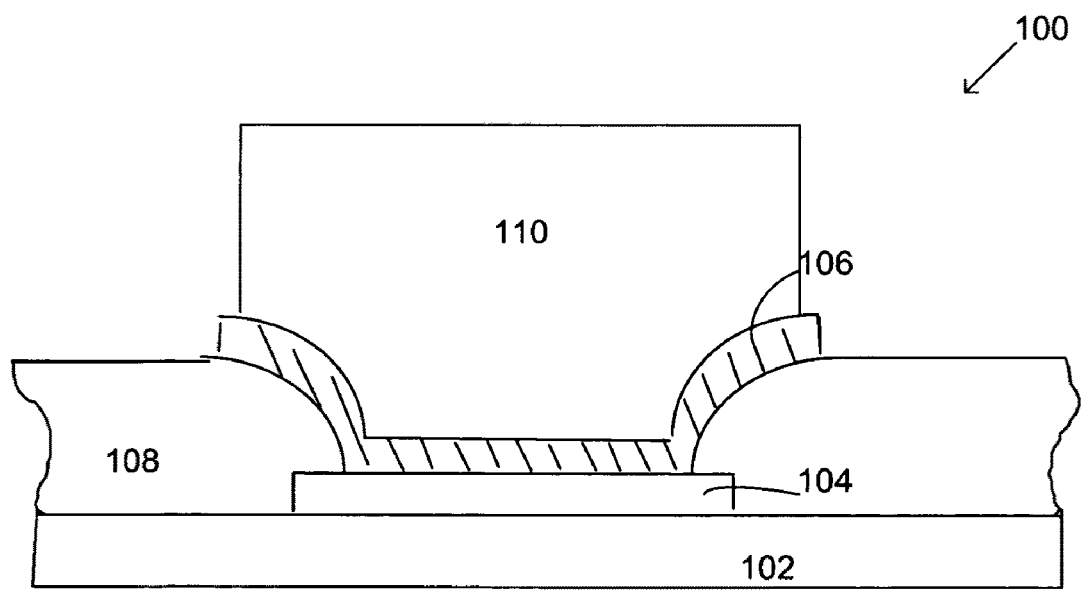
Figure 1C:
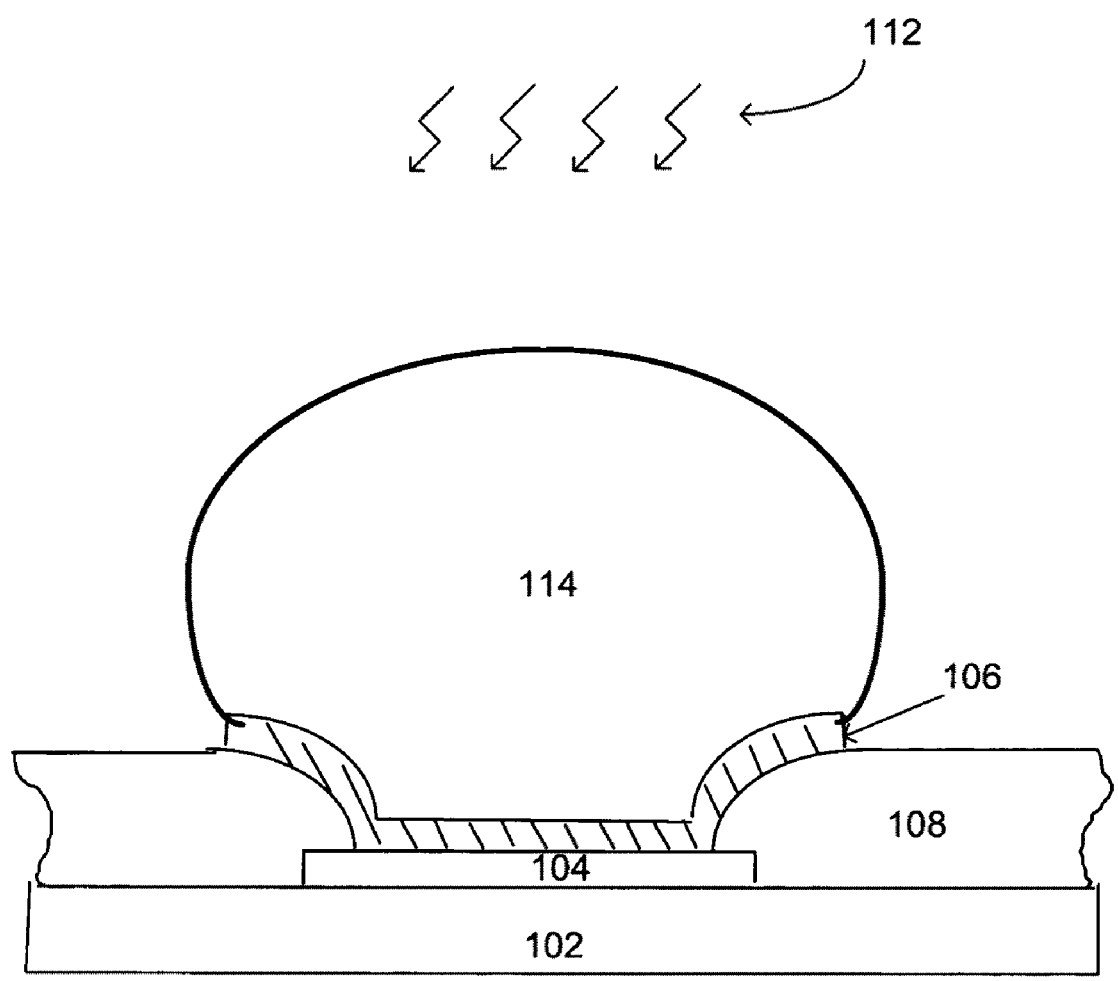

FIGS. 1a-1c illustrate embodiments of methods of forming microelectronic structures, such as package and joint structures, for example. FIG. 1a illustrates a portion of a substrate 100. The substrate 100 may comprise a portion of a controlled collapse chip connection (C4) structure, for example. The substrate 100 may further comprise a device portion 102. The device portion 102 may comprise devices such as transistors, resistors, or conductors that may form an integrated circuit. In another embodiment, the device portion 102 may include devices that together form multiple microprocessor cores on a single die.

In one embodiment, the device portion 102 of the substrate 100 may further be comprised of materials such as, but not limited to, silicon, silicon-on-insulator, germanium, indium antimonide, lead telluride, indium arsenide, indium phosphide, gallium arsenide, gallium antimonide, or combinations thereof. The device portion 102 may further include interconnect regions (not shown) that may provide electrical interconnection for the various devices of the device portion 102. The interconnect regions may include stacks of metallization layers which may include metal lines that may be separated and/or insulated by dielectric materials.

The substrate 100 may comprise a ball limiting metallization (BLM) 106, and a passivation material 108. The BLM 106 may be disposed on a bond pad 104. In an embodiment, the BLM 106 may comprise a multilayer BLM, such as but not limited to a stack comprising titanium/aluminum/titanium/nickel vanadium, wherein the bottom layer of titanium may be disposed on the bond pad 106. In an embodiment, the bond pad 104 may comprise a copper bond pad 104.

A solder material 110, may be formed on/applied to the BLM and thus the bonding pad 104 of the substrate 100. The solder material 110 may comprise a lead free solder material 110, and may include SnAg, SnAgCu, SnCu and other such lead free solder compositions. In an embodiment, the solder material 110 may comprise/be doped with nickel. In an embodiment, the nickel may comprise 1-2 ppm to about 0.2 weight percentage of the solder material 110. The nickel doping of the solder material 110 may serve to suppress intermetallic growth that may occur at solder/copper interfaces during subsequent processing, and therefore improves electromigration resistance at such copper/solder interfaces of device employing solder material 110 according to embodiments of the present invention.

For example, nickel doping into lead free solder alloy materials retards a Cu3Sn intermetallic growth in second-level-interconnect BGA structures. This IMC reduction serves to improve the reliability of the solder material 110 when it is joined with a copper surface, such as with a package substrate copper surface and/or a die pad copper surface, for example. The strong chemical affinity of tin in the solder material 110 with that of the nickel dopant, in conjunction with a nickel concentration gradient that may occur across a solder joint, for example, will drive nickel segregation and reaction at the copper/solder interface.

The doped solder material 110 may further be exposed to a reflow process 112 (FIG. 1c). In an embodiment, the reflow process 112 may comprise a temperature of below about 270 degrees Celsius, for example, that may comprise the reflow temperature for the solder material 110. The reflow temperature parameters may vary according to the particular reflow process employed. at solder/copper interfaces. The doped solder material 110 may form a nickel doped interconnect structure/solder ball 114 after undergoing the reflow process 112.

Figure 2:
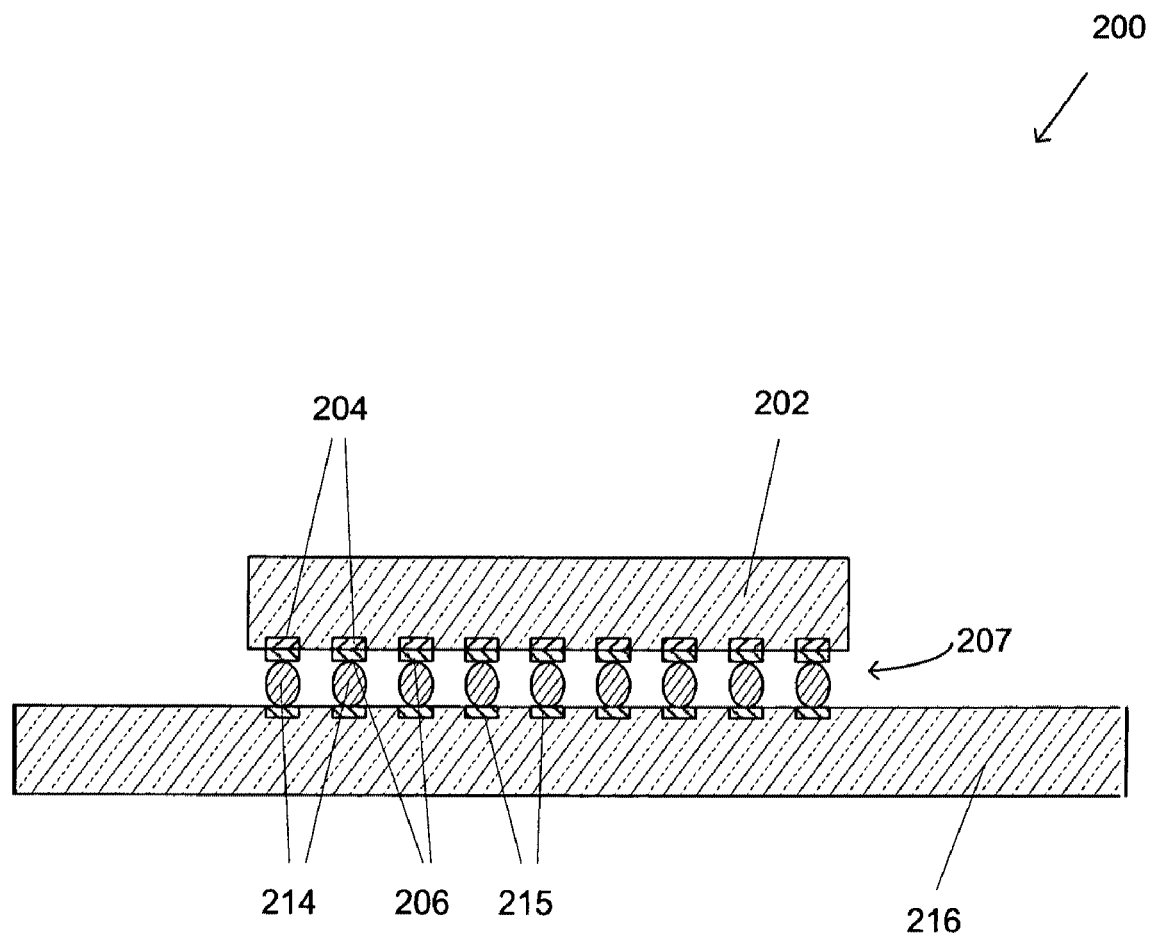
FIG. 2 represents structures according to embodiments of the present invention.

FIG. 2 depicts a microelectronic package structure 200 according to an embodiment. The package structure 200 includes a package substrate 216, and a die 202 (similar to the die 102 of FIG. 1a), wherein a plurality of joint structures 207 are disposed and connected/electrically coupled between the die 202 and the package substrate 216. In one embodiment, the package substrate 216 may comprise at least one of a motherboard, a printed circuit board (PCB), an interposer, a test coupon, and a land grid array socket.

Referring still to FIG. 2, the joint structures 207 include BLM (similar to the BLM 106 of FIG. 1a) 206 disposed on the die 202, and package substrate surface finish 215 disposed on the package substrate 216. In an embodiment, the surface finish 215 may comprise such surface finishes as ENIG, ENIG-EG, NiPdAu surface finish as are known in the art. As is well known, the BLM 206 on the die 202 and the surface finish 215 allow an electrical bonding of the die 202 and the package substrate 216, respectively, to external circuitry. A bond pad 204, such as a copper bond pad 204, may be disposed on the die 202, between the BLM 206 and the die 202.

As further shown in FIG. 2, joint structures 207 further comprise interconnect structures 214 bonding the die 202 and the package substrate 216 to one another. The interconnect structures 214, similar to the interconnect structures 114 of FIG. 1c, may comprise lead free solder material with nickel doping. In an embodiment, the interconnect structures 214 may comprise C4 interconnect structures. In an embodiment, the interconnect structures 214 may comprise between about 1-2 ppm of nickel and about 0.2 percent weight of the interconnect structure 214. In an embodiment, the nickel may be substantially uniformly distributed throughout each of the interconnect structures 214, and may be present in an amount sufficient to reduce the formation of copper tin inter-metallic compounds (IMC's), such as $Cu_3Sn$ and $Cu_5Sn_6$ inter-metallic compounds, for example. In an embodiment, a thickness of the $Cu_5Sn_6$ IMC may comprise a thickness of less than about 5 microns.

Figure 5:
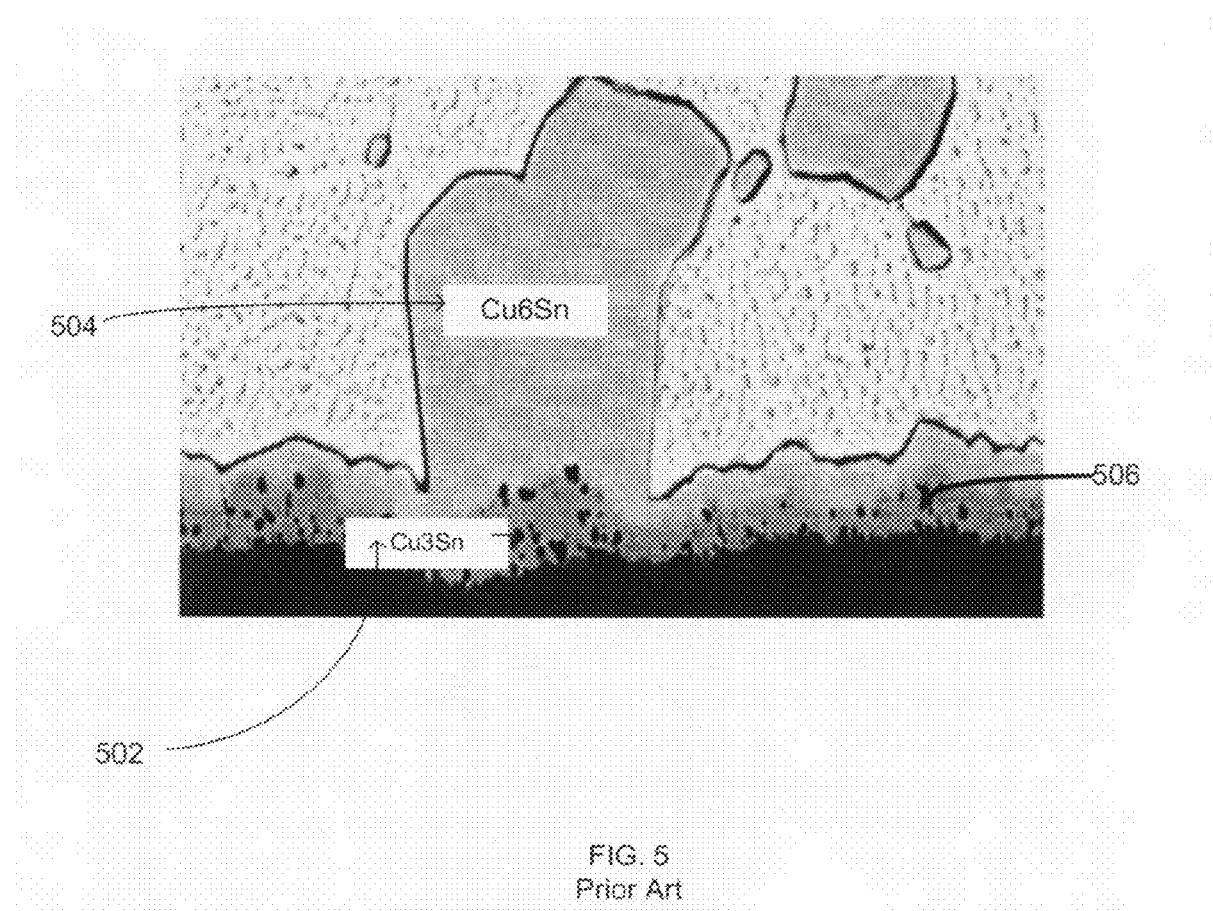
FIG. 5 represents a structure from the Prior Art.

In an embodiment, the growth of IMC's, including IMC's comprising a combination of tin with copper Cu may be slowed by the nickel doping by a factor of about four. The effective amount of nickel to be added to the solder material may be optimized for the particular application. Prior art package structures that do not comprise the nickel doped interconnect structures of the carious embodiments of present invention, may comprise increased amount/density of IMC's formed at copper/solder interfaces (FIG. 5).

For example, a prior art solder/copper interface of a prior art packaging structure may comprise a $Cu_3Sn$ 502 inner layer IMC and a $Cu_5Sn_6$ 504 outer layer IMC, with the inner layer IMC being porous with Kirkendall voids 506 arising from an unbalanced copper and tin diffusion that may occur during reflow and/or baking processing, for example. Excessive eletromigration failure may occur due to such IMC formation at copper/solder interface, and may significantly reduce assembly yield.

The interconnect structures comprising the solder material of the various embodiments of the present invention, however, impede the growth rate of copper tin IMC's, such as $Cu_3Sn$ IMC's and $Cu_5Sn_6$ IMC's, and in this way results in a reduction in electromigration failure for lead free tin-based solder joints. In an embodiment, grain size for a $Cu_5Sn$ IMC formed within a nickel doped lead free solder alloy according to embodiments of the present invention may comprise about 5 microns after reflow processing. In contrast, a prior art $Cu_5Sn_6$ IMC's formed within a non-nickel doped lead free solder alloy may comprise a grain size of about 20 microns after reflow processing. Thus, nickel doped lead free solder alloys comprise a finer grain size than the courser grain size possessed by non-nickel doped lead free solder alloys. Additionally, the reduction in voids caused by the decrease in IMC's formation and size, and the improved copper/solder interface, increases the overall strength, optimizes bump morphology, and improves overall BLM reliability and die yield.

Figure 3:
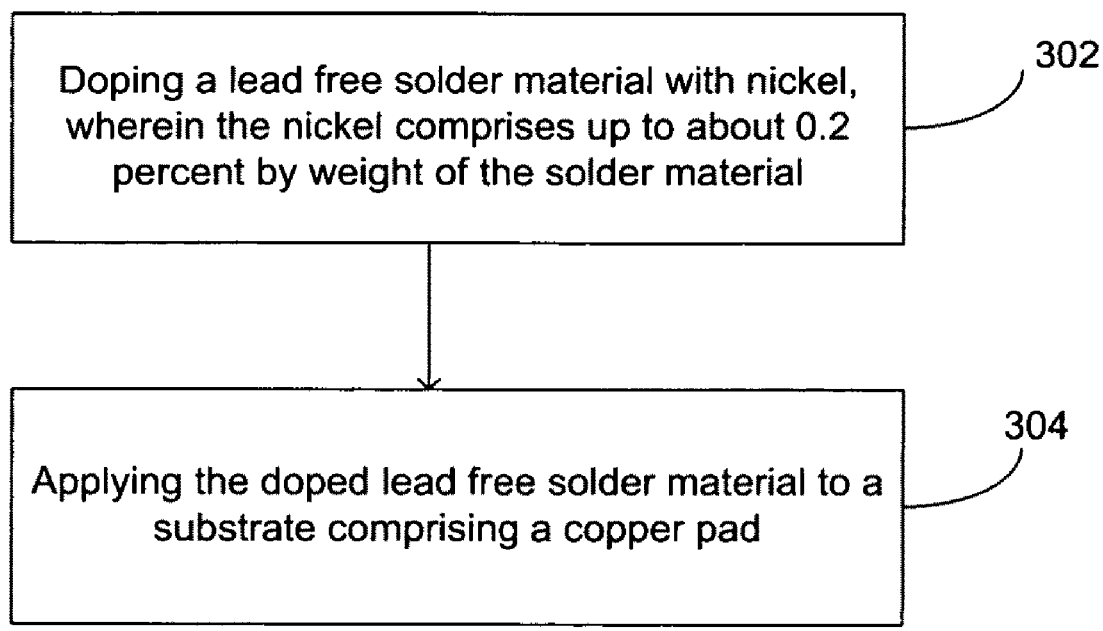
FIG. 3 represents a flow chart according to an embodiment of the present invention.

Referring to FIG. 3, a flowchart is shown of a process for doping a solder material according to an embodiment. At step 302, a lead free solder material is doped with nickel, wherein the nickel comprises up to about 0.2 percent by weight of the solder material. In an embodiment, the doping may be achieved through conventional solder alloying procedures, such as, for example, by mixing pure respective metal elements according to a designated composition, and then heating up the mixture to melt the same, stirring constantly to ensure uniformity of the alloy distribution. After cool down, a homogenization process may be effected in a temperature below the liquidus of a lead free solder alloy, for example.

At step 304, the doped lead free solder material may be applied to a substrate comprising a copper pad. In an embodiment, the doped solder material thus fabricated may be used in a conventional C4 bumping and bonding process as would be recognized by one skilled in the art. Although a method embodiment for forming nickel doped lead free solder is described above, embodiments include within their scope the provision of a doped lead free solder composition in any form, such as, for example, in the form of micro solder-balls.

Figure 4:
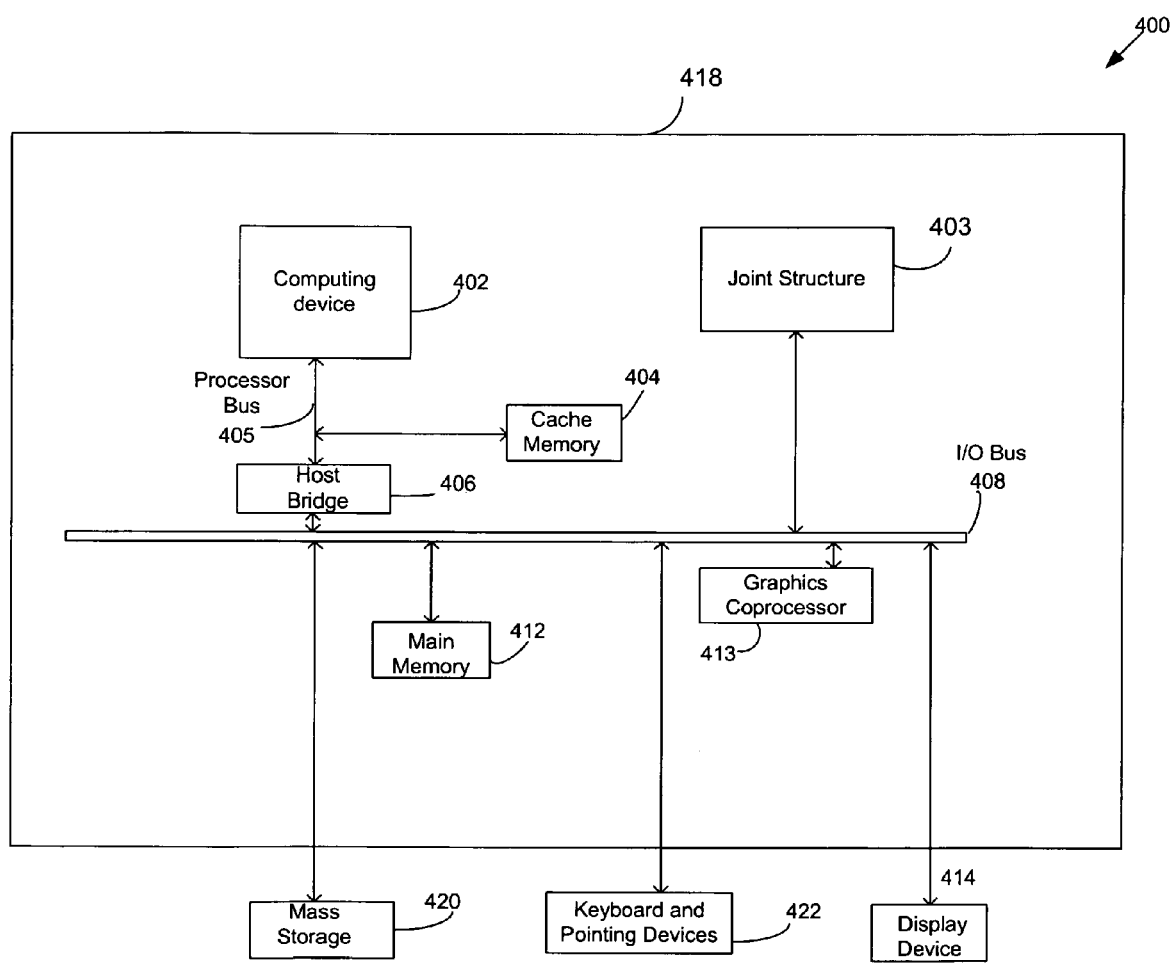
FIG. 4 represents a system according to embodiments of the present invention.

FIG. 4 is a diagram illustrating an exemplary system 400 capable of being operated with microelectronic structures of the present invention, such as the joint structure 207 comprising the interconnect structure 216 of FIG. 2, for example. It will be understood that the present embodiment is but one of many possible systems in which the conductive interconnect structure of the present invention may be used.

In the system 400, the joint structure 424 may be communicatively coupled to a printed circuit board (PCB) 418 by way of an I/O bus 408. The communicative coupling of the joint structure 424 may be established by physical means, such as through the use of a package and/or a socket connection to mount the joint structure 424 to the PCB 418 (for example by the use of a chip package, interposer and/or a land grid array socket). The joint structure 424 may also be communicatively coupled to the PCB 418 through various wireless means (for example, without the use of a physical connection to the PCB), as are well known in the art.

The system 400 may include a computing device 402, such as a processor, and a cache memory 404 communicatively coupled to each other through a processor bus 405. The processor bus 405 and the I/O bus 408 may be bridged by a host bridge 406. Communicatively coupled to the I/O bus 408 and also to the joint structure 424 may be a main memory 412. Examples of the main memory 412 may include, but are not limited to, static random access memory (SRAM) and/or dynamic random access memory (DRAM), and/or some other state preserving mediums. The system 400 may also include a graphics coprocessor 413, however incorporation of the graphics coprocessor 413 into the system 400 is not necessary to the operation of the system 400. Coupled to the I/O bus 408 may also, for example, be a display device 414, a mass storage device 420, and keyboard and pointing devices 422.

These elements perform their conventional functions well known in the art. In particular, mass storage 420 may be used to provide long-term storage for the executable instructions for a method for forming joint structure in accordance with embodiments of the present invention, whereas main memory 412 may be used to store on a shorter term basis the executable instructions of a method for forming joint structure in accordance with embodiments of the present invention during execution by computing device 402. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 412 may supply the computing device 202 (which may be a processor, for example) with the executable instructions for execution.

Benefits of the present invention include reducing assembly yield loss due to solder joint failures. Nickel doping into lead free solder BGA alloys suppresses both Cu3Sn innerlayer and Cu5Sn6 outer layer growth, thus leading to an increase of BGA solder joint interfacial strength. Suppression of interfacial IMC growth due to nickel doping can help prolonging the electromigration life of first level interconnect (FLI) solder joints.

Embodiments of the present invention enable the incorporation of stubby solder bumps, which comprise a shortened die copper bump and an increased solder bump height. A key idea is to increase compliant C4 solder volume and decrease stiff copper bump volume for such a solder joint geometry so as to facilitate the absorption of die ILD stress. Additionally this new FLI geometry design rule of electromigration resistance is enhanced by the reduction in IMC growth at copper/solder interface. Nickel doping lead free solder BGA alloys according to embodiments of the present invention achieves a die-to-package integration solution for the next generation of package structures, thus enabling the assembly and integration of increasingly fragile die ILD architecture.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as joint and package structures, are well known in the art. Therefore, the Figures provided herein illustrate only portions of an exemplary microelectronic device that pertains to the practice of the present invention. Thus the present invention is not limited to the structures described herein.

What is claimed is:

1. A structure comprising: a bond pad disposed on a substrate; and a lead free solder interconnect disposed on the bond pad, the lead free solder interconnect comprises at least one lead free solder material that is doped, the solder material selected from the group consisting of SnAg, SnAgCu and SnCu, wherein the lead free solder material is doped with only nickel, wherein the doped lead free solder material comprises a percentage of about 1 ppm nickel.

2. The structure of claim 1, wherein the bond pad comprises copper, and further comprises a BLM.

3. The structure of claim 1, further comprising where the lead free solder interconnect comprises a portion of a solder joint structure.

4. The structure of claim 3, wherein the solder joint structure comprises a portion of a FLI.

5. The structure of claim 1, wherein the substrate comprises a portion of a microelectronic device, and wherein the lead free solder interconnect comprises a portion of a solder joint.

6. The structure of claim 5 wherein a copper tin intermetallic formed in the solder joint comprises a fine grain size.

\* \* \* \* \*